(12) United States Patent
Tanaka

(10) Patent No.: US 10,002,754 B2
(45) Date of Patent: Jun. 19, 2018

(54) SUBSTRATE PROCESSING METHOD AND RECORDING MEDIUM

(71) Applicant: Tokyo Electron Limited, Tokyo (JP)

(72) Inventor: Keiichi Tanaka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days. days.

(21) Appl. No.: 15/198,030

(22) Filed: Jun. 30, 2016

(65) Prior Publication Data
US 2017/0004993 A1    Jan. 5, 2017

(30) Foreign Application Priority Data

Jul. 2, 2015 (JP) .................................. 2015-133662

(51) Int. Cl.
| | |
|---|---|
| *H01L 21/02* | (2006.01) |
| *H01L 21/311* | (2006.01) |
| *H01L 21/67* | (2006.01) |
| *H01L 21/687* | (2006.01) |

(52) U.S. Cl.
CPC .... *H01L 21/0206* (2013.01); *H01L 21/31111* (2013.01); *H01L 21/31133* (2013.01); *H01L 21/6708* (2013.01); *H01L 21/67028* (2013.01); *H01L 21/67051* (2013.01); *H01L 21/68721* (2013.01)

(58) Field of Classification Search
CPC ........... H01L 21/0206; H01L 21/68721; H01L 21/67028; H01L 21/31111; H01L 21/31133; H01L 21/6708; H01L 21/67051
See application file for complete search history.

(56) References Cited

U.S. PATENT DOCUMENTS

| | | | | |
|---|---|---|---|---|
| 7,410,885 | B2* | 8/2008 | Schuehrer | ......... H01L 21/02087 257/E21.088 |
| 2007/0224773 | A1* | 9/2007 | Murakami | ........ H01L 21/26533 438/400 |

FOREIGN PATENT DOCUMENTS

JP        2003-092343 A    3/2003

\* cited by examiner

*Primary Examiner* — Duy Deo
*Assistant Examiner* — Mahmoud Dahimene
(74) *Attorney, Agent, or Firm* — Pearne & Gordon LLP

(57) ABSTRACT

Electric charging of a substrate caused by a friction between a fluid and a surface of the substrate being rotated can be suppressed. At least a part of a surface insulating layer (thermal oxide film) on a peripheral portion of a substrate W is removed, and an underlayer (silicon wafer) having higher conductivity than a material of the surface insulating layer is exposed. Then, a process is performed on the substrate while holding and rotating the substrate by a substrate holding device. Here, at least a portion of the substrate holding device which comes into contact with the underlayer is made of a conductive material. In performing the process on the substrate, an electric charge generated in the surface insulating layer of the substrate is removed via the underlayer and the substrate holding device.

4 Claims, 7 Drawing Sheets

SUBSTRATE PROCESSING METHOD AND RECORDING MEDIUM

CROSS-REFERENCE TO RELATED APPLICATION

This application claims the benefit of Japanese Patent Application No. 2015-133662 filed on Jul. 2, 2015, the entire disclosures of which are incorporated herein by reference.

TECHNICAL FIELD

The embodiments described herein pertain generally to a technique of suppressing electric charging of a substrate caused by a friction between a fluid and a surface of the substrate being rotated.

BACKGROUND

In a manufacturing process of a semiconductor device, various liquid processes such as a wet etching process, a cleaning process and a coating film forming process are performed by supplying processing liquids onto a substrate such as a semiconductor wafer. For example, when performing the liquid process on the substrate by supplying the processing liquid while rotating the substrate and when performing a shake-off drying process on the substrate after the processing liquid is supplied, frictional charging may occur in a surface of the substrate due to a friction between the surface of the substrate and the liquid remaining on the surface of the substrate or due to a friction between the surface of the substrate and an ambient atmosphere. If a surface potential of the substrate is increased as a result of the charging of the substrate, electrostatic breakdown of a device formed on the substrate may occur.

To suppress the electrostatic breakdown of the device while performing a rinsing process, there is proposed a method of using a rinse liquid which is prepared by dissolving carbon dioxide or ammonia in pure water and thus has conductivity. The acidic or alkaline rinse liquid, however, may inflict damage on a film which forms the device. Further, in this method, the electric charging caused by the friction between the surface of the substrate and the ambient atmosphere when performing the shake-off drying process cannot be suppressed sufficiently.

Further, there is also known a method in which a substrate holding member of a spin chuck is formed of a conductive member, and electric charges, which are generated in the surface of the substrate due to the friction, are released through the conductive member (see, for example, Patent Document 1). In this method, however, a sufficient charge removal effect may not be obtained when the entire surface of the substrate is covered with an insulating (dielectric) material.

Patent Document 1: Japanese Patent Laid-open Publication No. 2003-092343

SUMMARY

In view of the foregoing, exemplary embodiments provide a technique of suppressing electric charging of a substrate caused by a friction between a fluid and a surface of the substrate being rotated.

In one exemplary embodiment, there is provided a substrate processing method includes preparing a substrate having a surface insulating layer made of an insulating material; exposing an underlayer having higher conductivity than the material of the surface insulating layer, by removing at least a part of the surface insulating layer on a peripheral portion of the substrate; and performing a process on the substrate while holding and rotating, by a substrate holding device, a portion of the substrate where the underlayer is exposed. Here, at least a portion of the substrate holding device which comes into contact with the underlayer is made of a conductive material. Further, in the performing of the process on the substrate, an electric charge generated in the surface insulating layer of the substrate is removed via the underlayer and the substrate holding device.

In another exemplary embodiment, there is provided a computer-readable recording medium having stored thereon computer-executable instructions that, in response to execution, cause a substrate liquid processing system to perform the substrate processing method.

In still another exemplary embodiment, there is provided a substrate processing apparatus includes a first processing unit configured to perform, by removing, from a substrate having a surface insulating layer made of an insulating material, at least a part of the surface insulating layer on a peripheral portion of the substrate, an underlayer exposing process of exposing an underlayer having higher conductivity than the material of the surface insulating layer; and a second processing unit configured to perform a process on the substrate while holding and rotating, by a substrate holding device, a portion of the substrate where the underlayer is exposed. Here, at least a portion of the substrate holding device of the second processing unit which comes into contact with the underlayer is made of a conductive material, and an electric charge generated in the surface insulating layer of the substrate is removed via the underlayer and the substrate holding device.

According to the exemplary embodiments, by removing the surface insulating layer, electric charges generated in the substrate can be removed via the substrate holding device efficiently.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
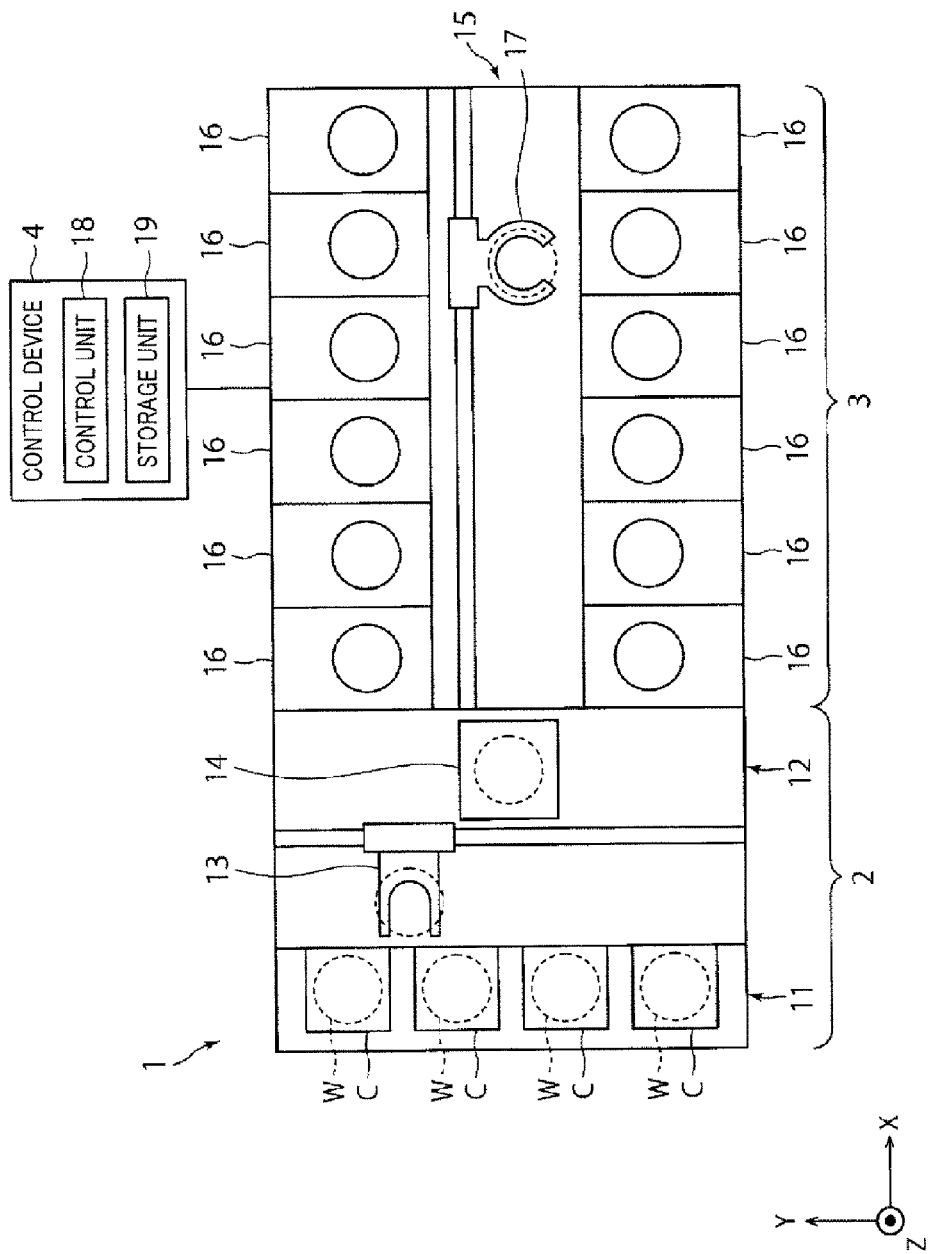
FIG. 1 is a plan view illustrating an outline of a substrate processing system configured to perform a substrate processing method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing portion 11 and a transfer portion 12. In the carrier placing portion 11, a plurality of carriers C is placed to accommodate a plurality of substrates (semiconductor wafers in the present exemplary embodiment) (hereinafter, referred to as "wafers W") horizontally.

The transfer portion 12 is provided adjacent to the carrier placing portion 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer portion 12. The processing station 3 is provided with a transfer portion 15 and a plurality of processing units 16. The plurality of processing units 16 is arranged at both sides of the transfer portion 15.

The transfer portion 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing portion 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing portion 11 by the substrate transfer device 13.

Figure 2:
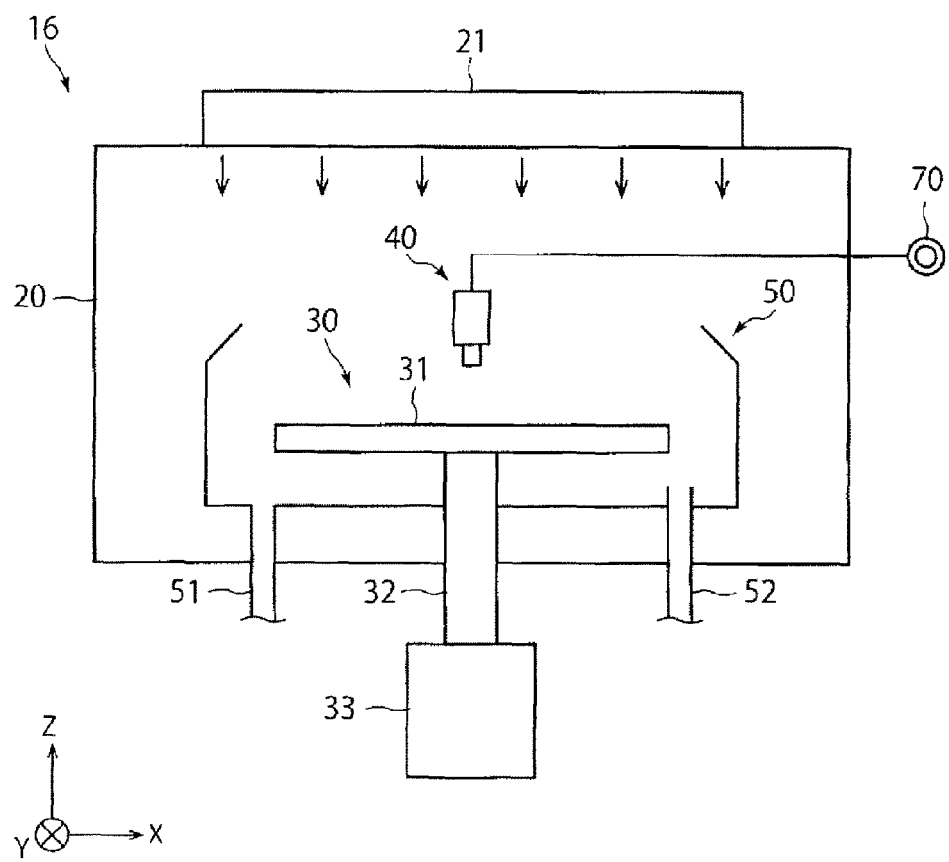
FIG. 2 is a diagram schematically illustrating a configuration of a processing unit provided in the substrate processing system.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

Figure 3:
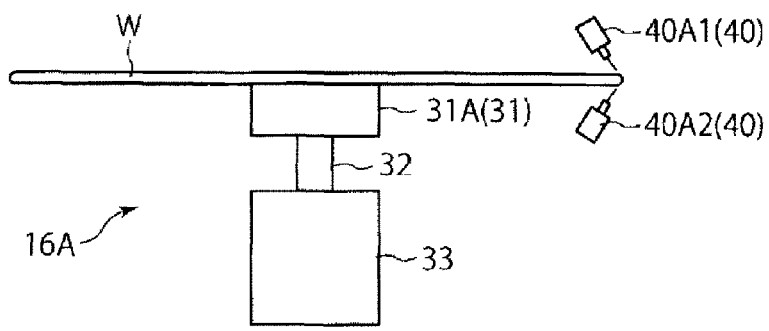
FIG. 3 is a diagram schematically illustrating a bevel etching unit employed in performing the substrate processing method.
Figure 4:
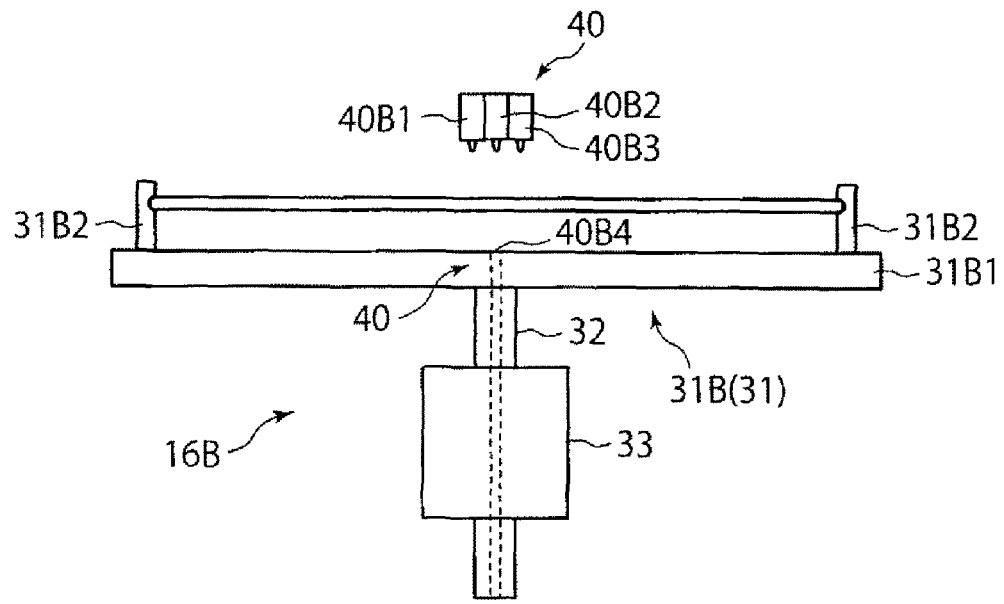
FIG. 4 is a diagram schematically illustrating a chemical liquid cleaning unit employed in performing the substrate processing method.

The plurality of processing units 16 of the substrate processing system 1 may include a bevel etching unit 16A (FIG. 3) and a chemical liquid cleaning unit 16B (FIG. 4).

The bevel etching unit 16A is configured to perform a bevel etching process of removing a film (in the present exemplary embodiment, a surface insulating layer to be described later) formed on a peripheral portion of the wafer W including a bevel portion of the wafer W by supplying a chemical liquid for bevel etching onto the peripheral portion of the wafer W.

As depicted in FIG. 3, the bevel etching unit 16A includes a vacuum chuck 31A as a constituent component corresponding to the holding unit 31 of FIG. 2; and one or more chemical liquid nozzles 40A1 and 40A2 as a constituent component corresponding to the processing fluid supply unit 40 of FIG. 2. The vacuum chuck 31A is configured to attract and hold a central portion of a bottom surface (rear surface) of the wafer W, and the chemical liquid nozzles 40A1 and 40A2 are configured to supply the chemical liquid for bevel etching onto the bevel portion of the wafer W. In the present exemplary embodiment shown in FIG. 3, the two chemical liquid nozzles 40A1 and 40A2 configured to supply the chemical liquid to a peripheral portion of a top surface (a front surface as a device formation surface) of the wafer and to a peripheral portion of a bottom surface (a rear surface where no device is formed) of the wafer, respectively, are provided.

The bevel etching unit 16A may further include, as constituent components corresponding to the processing fluid supply unit 40 of FIG. 2, a rinse nozzle (not shown) configured to supply a rinse liquid to an inner position than a target position of the chemical liquid supplied from the chemical liquid nozzles 40A1 and 40A2 to the wafer W in a radial direction; and a drying gas nozzle (not shown) configured to supply a drying gas, e.g., a nitrogen gas, to an inner position than a target position of the rinse liquid supplied from the rinse nozzle to the wafer W in the radial direction.

Except this configuration described above, the other configuration of the bevel etching unit 16A is the same as that shown in FIG. 2. Since the bevel etching unit 16A is well known to those skilled in the art, detailed description will be omitted herein.

The chemical liquid cleaning unit 16B is configured to perform a chemical liquid cleaning process of removing an unnecessary substance (unnecessary metal, oxide film, contaminant, etc.) adhering to the top surface of the substrate by supplying the chemical liquid onto the top surface of the wafer W. The chemical liquid used in the chemical liquid cleaning process may be, by way of example, but not limitation, $SPM(H_2SO_4+H_2O_2)$, $DHF(HF+H_2O)$, $SC-1$ $(NH_4OH+H_2O_2+H_2O)$, $SC-2(HCl+H_2O_2+H_2O)$, or the like.

As depicted in FIG. 4, the chemical liquid cleaning unit 16B includes, as a constituent component corresponding to the holding unit 31 of FIG. 2, a holding device 31B configured to hold the substrate while being in contact with the peripheral portion of the wafer W. The holding device 31B includes a base plate 31B1 and a plurality of holding members 31B2 provided at periphery portions of the base plate 31B1. The holding members 31B2 are configured to hold the wafer W thereon while being in contact with the peripheral portion of the wafer W.

The chemical liquid cleaning unit 16B further includes, as a constituent component corresponding to the processing fluid supply unit 40 of FIG. 2, a chemical liquid nozzle 40B1 configured to supply the chemical liquid onto the top surface of the wafer W; a rinse nozzle 40B2 configured to supply a rinse liquid onto the top surface of the wafer W; and a solvent nozzle 40B3 configured to supply a supplement drying solvent such as IPA (IsoPropyl Alcohol) onto the top surface of the wafer W. The chemical liquid cleaning unit 16B further includes, as a constituent component corresponding to the processing fluid supply unit 40 of FIG. 2, at least one backside nozzle 40B4 configured to supply a processing fluid (e.g., rinse liquid, drying gas, etc.) to the bottom surface of the wafer W. The backside nozzle 40B4 may be implemented by a top end opening of a fluid passageway extended in an axis line direction within the support unit (rotation shaft) 32.

A layer of a material having relatively high electric conductivity (hereinafter, referred to as "conductive layer") is exposed at a bevel portion or an end surface of the wafer W by the bevel etching unit 16A, as will be described in detail later. At least a part of each holding member 31B2 that comes into contact with the conductive layer is made of a conductive material. The conductive material may be a material which is not abraded when it comes into contact with the wafer so that no particle is generated. Further, the conductive material may be a material from which no contaminant is eluted when it is submerged in the processing liquid used in the processing unit. Such a conductive material may be, by way of non-limiting example, glassy carbon. The conductive material may be coated only on a surface portion of each holding member 31B2 by coating or the like.

The holding members 31B2 and the base plate 31B1 are electrically connected, and the holding device 31B (base plate 31B1) and the support unit 32 is electrically connected. The support unit 32 of the chemical liquid cleaning unit 16B is grounded. As a result, the electric charges moved to the holding members 31B2 from the wafer W can be released through the support unit 32. Here, a path through which the electric charges are released (removed) from the support unit 32 is not particularly limited. For example, the electric charges may be released via, for example, the driving unit 33.

Now, a series of processes performed by the substrate processing system 1 will be explained.

First, a wafer W to be processed, an entire of which or a wide area of which is covered with a layer made of an insulating material as a topmost layer (uppermost surface layer) (hereinafter, referred to as "surface insulating layer"), is carried into the bevel etching unit 16A. In the bevel etching unit 16A, the surface insulating layer formed on the bevel portion is removed, so that a layer underneath thereof, which is made of a conductive material (hereinafter, referred to as "conductive layer"), is exposed.

A pattern of removing the surface insulating layer may be determined depending on a contact position between the wafer W and the holding members 31B2. At least, the surface insulating layer on a region of the peripheral portion of the wafer W which is likely to come into contact with the holding members 31B2 need to be removed.

Figure 5:
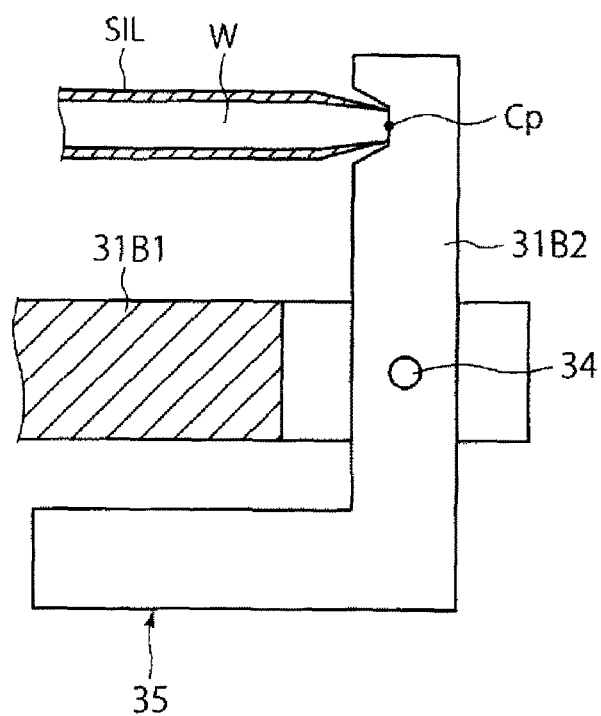
FIG. 5 is a schematic diagram illustrating an example of a holding member.

To elaborate, as shown in FIG. 4 and FIG. 5, for example, if a grip claw as the holding member 31B2 presses the wafer W from a lateral side thereof and comes into contact with the wafer W at a contact point Cp within the end surface (also called as an apex) of the wafer W, only the surface insulating layer on a region near the contact point Cp need to be removed. By way of example, the surface insulating layer SIL may be left as indicated by hatching in FIG. 5. That is, the surface insulating layer on a front bevel and a back bevel (inclined surfaces) may not be removed completely.

Further, the grip claw as the holding member 31B2 shown in FIG. 5 is configured to be pivoted around a pin 34 provided at the base plate 31B1. A non-illustrated spring configured to press the grip claw against the wafer W is provided in the vicinity of the pin 34. By pressing the grip claw with a non-illustrated pressing member as indicated by an arrow 35, the wafer W is released from the grip claw.

Figure 6:
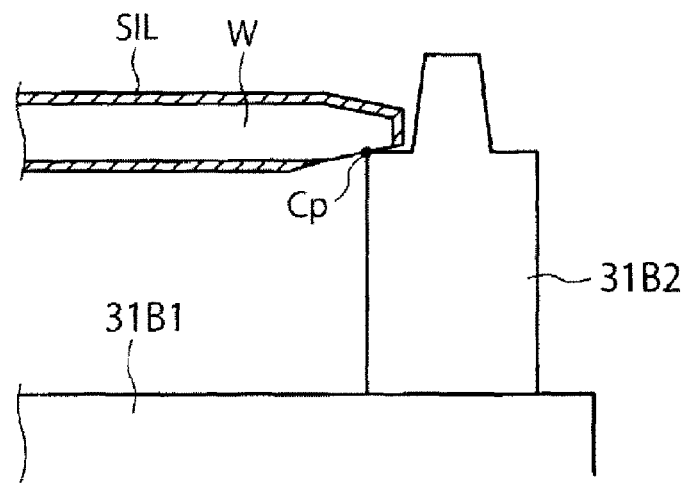
FIG. 6 is a schematic diagram illustrating another example of the holding member.

Furthermore, as depicted in FIG. 6, for example, if the wafer W is simply placed on a supporting pin as the holding member 31B2 and the supporting pin comes into contact with the wafer W at a contact point Cp within the back bevel, only the surface insulating layer at a region (back bevel) near the contact point Cp needs to be removed. That is, the surface insulating layer SIL needs to be left as indicated by hatching in FIG. 6. Further, in this case, the chemical liquid nozzle 40A1 (see FIG. 3) may not be provided in the bevel etching unit 16A.

As stated above, after the surface insulating layer within the region determined according to the holding mechanism of the holding member 31B2 is removed, a rinsing process and a drying process are performed upon the peripheral portion of the wafer W. Thereafter, the wafer W is transferred from the bevel etching unit 16A into the chemical liquid cleaning unit 16B.

The wafer W transferred into the chemical liquid cleaning unit 16B is rotated about a vertical axis line, and by supplying the cleaning chemical liquid onto the top surface (the front surface as the device formation surface) of the wafer W in this state, the chemical liquid cleaning process is performed. Then, by supplying IPA onto the top surface of the wafer W while continuously rotating the wafer W, a replacement process of replacing the DIW remaining on the top surface of the wafer W with the IPA is performed. Afterwards, a drying process of drying the wafer W by continuously rotating the wafer W (desirably, by increasing a rotational speed of the wafer W) is performed.

Since the chemical liquids such as SPM, DHF, SC-1 and SC-2 have relatively high electric conductivity, the wafer W is not electrically charged while performing the chemical liquid cleaning process. In the subsequent rinsing process, however, the wafer W may be electrically charged due to a frictional force generated between the top surface of the wafer W and the DIW flowing from a central portion of the top surface of the wafer toward a peripheral portion thereof. Further, in the replacement process as well, the wafer W may be electrically charged due to a frictional force generated between the IPA and the surface of the wafer W. Furthermore, in the drying process, there is a likelihood that the wafer W may be electrically charged due to a frictional force generated between the surface of the wafer W and the ambient atmosphere around the wafer W.

In addition, in case of performing a process of discharging the DIW to the bottom surface of the wafer W being rotated from the backside nozzle 40B4 (typically, this process is performed together with the chemical liquid cleaning process and the rinsing process), there is a high likelihood that the top surface of the wafer W as the device formation surface may be electrically charged with positive charges by induction charging. Such a charging with the positive charges is not desirable, especially from the viewpoint of suppressing electrostatic breakdown of the device.

According to the present exemplary embodiment, however, before the series of processes in the chemical liquid cleaning unit 16B are performed, the surface insulating layer on the regions of the wafer W which come into contact with the holding members 31B2 is removed by the bevel etching unit 16A, so that the conductive layer underneath thereof is exposed. Accordingly, even if the electric charges are generated within the wafer W by the friction, those electric charges are removed from the wafer W through the holding members 31B2 which are in electric contact with the conductive layer, before the large amount of the electric charges are accumulated. Therefore, it is possible to suppress the electrostatic breakdown of the device on the wafer W caused by the electric discharge of the accumulated electric charges.

Experimental Example 1

Now, an effect of the above-described exemplary embodiment will be discussed based on specific experimental examples.

Experiment 1

First, an experiment result of investigating a relationship between humidity around a wafer, hydrophobic property of a surface of the wafer and electric charging of the wafer will be explained. As samples, two kinds of wafers are prepared: one is a silicon wafer having a thermal oxide film (THOX) formed thereon by performing a thermal oxidation process (i.e., a wafer W having a hydrophilic surface) and the other is one prepared by performing a hydrophobizing process with HMDS (hexamethyldisilazane) on the wafer W having a hydrophilic surface (i.e., a wafer W having a hydrophobic surface). These samples are the simplest models having a stacked structure in which two layers of the THOX as the surface insulating layer and the silicon wafer itself as the conductive layer under the surface insulating layer are formed.

The following processes are performed on each of the wafer W having the hydrophilic surface and the wafer W having the hydrophobic surface. First, the wafer W is carried into the processing unit having the same configuration as the above-described chemical liquid cleaning unit 16B and held by the substrate holding mechanism 30 equipped with the above-described holding members 31B2. While rotating the wafer W at 1000 rpm, a nitrogen gas is continuously supplied to the central portion of the bottom surface of the wafer W from the backside nozzle 40B4, and a surface potential in the top surface of the wafer W is measured every 10 seconds. The surface potential is measured by using Quantox XP (produced by KLA-Tencor Corporation). At this time, a processing liquid is not supplied onto the top surface of the wafer W. As mentioned above, the induction charging may easily occur in the top surface of the wafer W in this process.

The humidity within the chamber 20 of the chemical liquid cleaning unit 16B is set to be at two levels: 40%, which is the same level as a typical humidity in the clean room; and 1% or 2.5%, which is super-low humidity. The super-low humidity is achieved by supplying CDA (Clean Dry Air) into the chamber 20 from the FFU 21. The humidity is measured by a hygrometer (not shown) provided in the vicinity of a top opening portion of the recovery cup 50 (FIG. 2). The surface potential of the wafer W before performing the process is 0.2 V.

Figure 7:
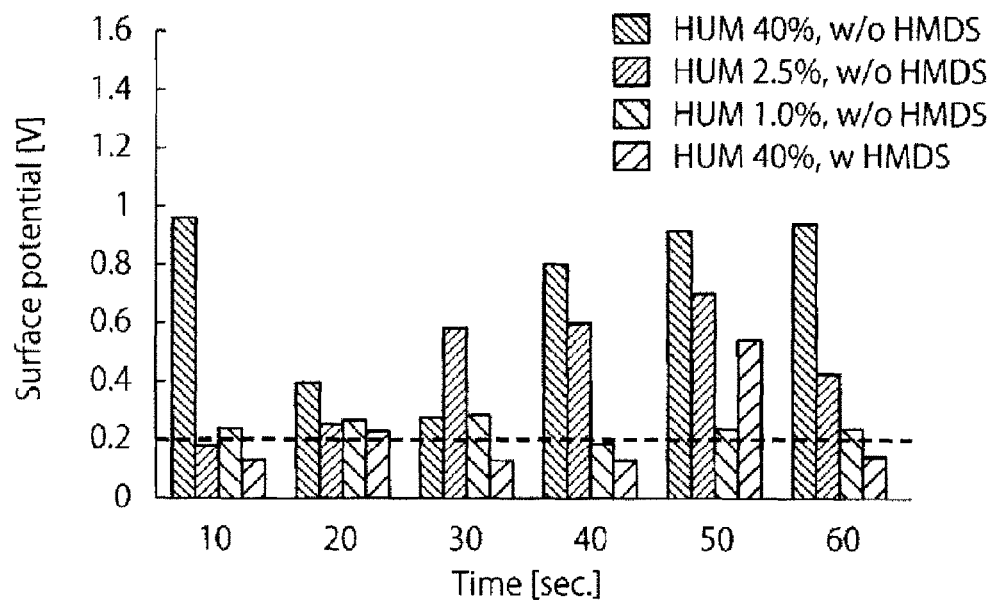
FIG. 7 is a graph showing a result of an experiment 1.

The result of the experiment 1 is shown in a graph of FIG. 7. On the graph of FIG. 7, a vertical axis represents the surface potential V of the wafer W, and a horizontal axis indicates the rotation time of the wafer W. At each rotation time, from the left in sequence, the surface potentials are indicated under respective conditions that "Humidity of 40% (HUM 40%) and without hydrophobizing process (w/o HMDS)", "Humidity of 2.5% (HUM 2.5%) and without hydrophobizing process (w/o HMDS)", "Humidity of 1.0% (HUM 1.0%), and without hydrophobizing process (w/o HMDS) and "Humidity of 40% (HUM 40%) and with hydrophobizing process (w HMDS), respectively.

As can be seen from the graph of FIG. 7, at all rotation times except the rotation time of 30 sec, the wafer W having the hydrophilic surface has the high surface potentials when the humidity around the wafer W is high. That is, as opposed to a general knowledge that the high-humidity atmosphere is advantageous to suppress the electric charging, this experiment result shows that the electric charging occurs more easily in the high-humidity atmosphere in case that the wafer W is being rotated. Further, under the atmosphere with the humidity of 40% where the wafer W having the hydrophilic surface is found to have a tendency to be easily electrically charged, the same process is also performed on the wafer W having the hydrophobic surface. As a result, the surface potential of this wafer W is found to have a fairly low level.

Regarding the result of Experiment 1 described above, the inventor has deemed as follows. When the humidity within the chamber is relatively high (40%), moisture floating within the chamber interfere with moisture adhering to the surface of the wafer (that is, friction occurs therebetween) while the wafer W is rotated. Accordingly, the electric charges may be easily generated. Meanwhile, when the humidity within the chamber is low, there hardly exist moisture floating within the chamber or adhering to the surface of the wafer. Thus, it is difficult for the electric charges to be generated. Further, in case that the surface of the wafer W is hydrophobic, it is difficult for the moisture to adhere to the surface of the wafer W even if the humidity within the chamber is relatively high. Thus, even if there is the moisture floating within the chamber, it is difficult for the electric charges to be generated.

Experiment 2

Under the condition of "Humidity within the chamber 20 is 40% and the surface of the wafer W is hydrophilic (without hydrophobizing process)" where the electric charging is found to occur most easily in the experiment 1, there is conducted an experiment of investigating an effect of removing the surface insulating layer of the wafer W on regions thereof in contact with the holding members 31B2. The conditions for this experiment are the same as those of the experiment 1 except that the surface insulting layer is removed and the rotational number of the wafer W is set to be at two levels of 1000 rpm and 1500 rpm.

Figure 8:
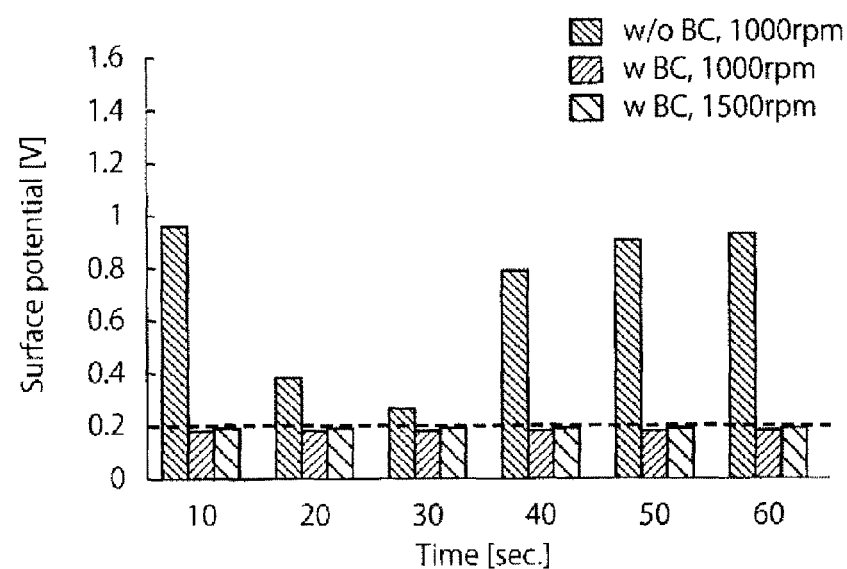
FIG. 8 is a graph showing a result of an experiment 2.

A graph of FIG. 8 shows a result of the experiment 2. On the graph of FIG. 8, a vertical axis represents the surface potential V of the wafer W, and a horizontal axis indicates the rotation time of the wafer W. At each rotation time, from the left in sequence, the surface potentials are indicated under respective conditions that "Humidity of 40% (HUM 40%), without removing insulating layer (w/o BC) and rotational number of 1000 rpm (the same as the result of the experiment 1)", "Removing of insulating layer (w BC) and rotational number of 1000 rpm" and "Removing of insulating layer (w BC) and rotational number of 1500 rpm", respectively. As can be clearly seen from the graph of FIG. 8, if the surface insulating layer is removed, the surface potential in the top surface of the wafer W is stabilized at very low levels regardless of the rotational number and the rotation time.

As clearly seen from the result of the experiment 2 described above, by removing the surface insulating layer, the electric charges generated in the insulating layer on the top surface of the wafer W can be removed from the wafer W through a conductive layer underneath thereof and the holding members 31B2. Accordingly, it is possible to suppress the electric charges from being accumulated in the wafer.

Further, though the above-described the experiment 1 and the experiment 2 are conducted under the conditions where the electric charging occurs most easily, the same effect of suppressing the electric charging of the wafer W may also be obtained under other conditions where the electric charging of the wafer W caused by removing the surface insulating layer is expected to occur. By way of example, it is expected that the electric charging of the wafer W may occur while performing the DIW rinsing process and the solvent replacement process conducted on the top surface of the wafer W and, also, while performing the shake-off drying process. When performing these processes, the effect of suppressing the electric charging of the wafer W can also be obtained by removing the surface insulating layer as described above.

Further, in the DIW rinsing process and the solvent replacement process upon the top surface of the wafer W, the effect of suppressing the electric charging can be further expected if the humidity around the wafer W is equal to or less than 1% or a contact angle between the pure water and the surface of the substrate is equal to or larger than 90°.

Figure 9:
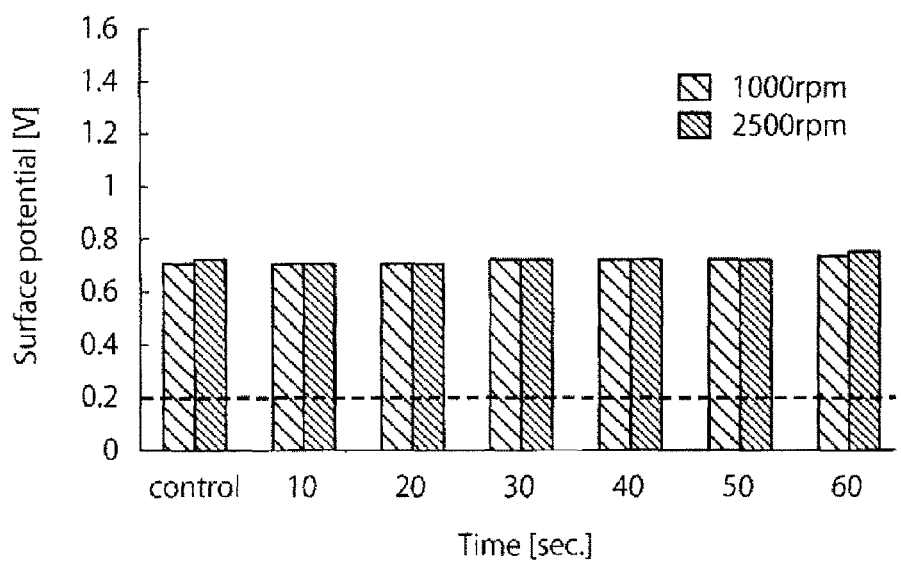
FIG. 9 is a graph showing a result of an experiment of investigating an electric charging tendency of an ArF resist.
Figure 10:
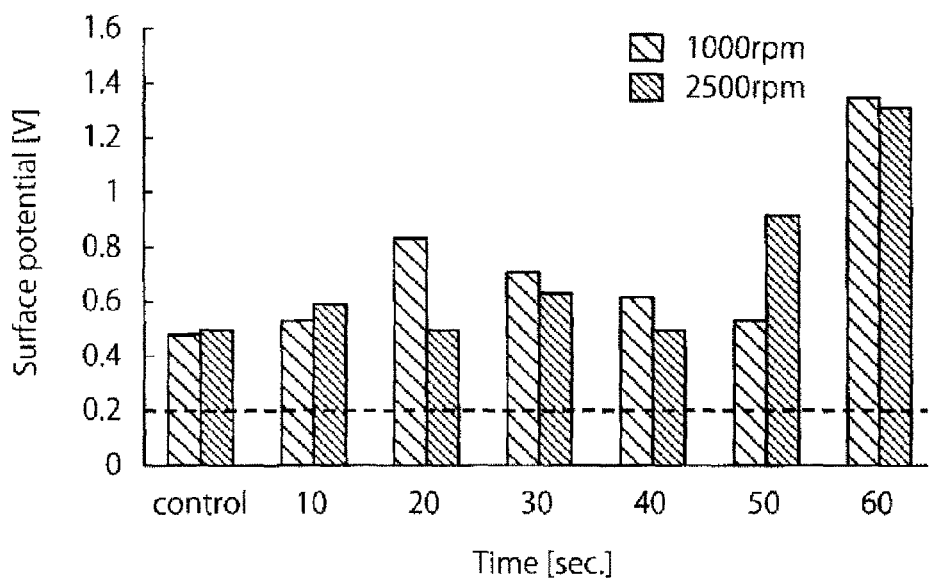
FIG. 10 is a graph showing a result of an experiment of investigating an electric charging tendency of a KrF resist.

FIG. 9 and FIG. 10 are graphs showing a result of a test of investigating an electric charging tendency in a surface of a silicon wafer W on which a thermal oxide film (THOX) is formed by performing a thermal oxidation process and, also, a resist film is further formed on the thermal oxide film (THOX). The conditions for this experiment is the same as those of the experiment 2 except that the humidity around the wafer W (humidity within the processing unit) is set to be 45% and the rotational number of the wafer is set to be at two levels of 1000 rpm and 2500 rpm.

FIG. 9 shows a result of a case where the resist film is made of an ArF resist (having a water contact angle of about 90 degrees), and FIG. 10 shows a result of a case where a resist film is made of a KrF resist (having a water contact angle of about 60 degrees). The way to interpret the graphs of FIG. 9 and FIG. 10 is the same as in FIG. 7 and FIG. 8. Here, in FIG. 9 and FIG. 10, however, "Control" implies a time immediately after the wafer W is placed on the holding members 31B2. As can be seen from this test result, the ArF resist having the larger contact angle (having higher hydrophobic property) is more difficult to electrically charge than the KrF resist having the small contact angle (having lower hydrophobic property). This test result is matched with the result of the experiment 1 showing that the wafer, on which the thermal oxide film is formed and the hydrophobizing process is performed on the thermal oxide film with the HMDS, is more difficult to electrically charge than the wafer, on which the thermal oxide film is formed and the hydrophobizing process is not performed on the thermal oxide film.

Furthermore, in the above description, the surface insulating layer is the thermal oxide film ($SiO_2$) which is made of an inorganic material. However, the exemplary embodiment is not limited thereto, and the above-described removal of the surface insulating layer at the peripheral portion of the wafer is still advantageous even in case that the surface insulating layer is made of an organic material (by way of example, a resist, an antireflection film of the resist, etc.). For example, when performing the DIW rinsing process of supplying the DIW while rotating the wafer on which the KrF resist (having the water contact angle of about 60 degrees) having slightly low hydrophobic property is formed, or when performing the shake-off drying process of drying this wafer under a high-humidity atmosphere, there is a likelihood that the wafer may be electrically charged. In these cases, by removing a part of the resist film prior to performing these processes in which the electric charging may occur, an underlayer, which is provided underneath the resist film and has higher conductivity, is exposed. Then, by performing these processes in the state that the exposed layer is in contact with the conductive holding members 31B2, the electric charging of the wafer W can be suppressed. There is no particular limitation in a combination of the material of the surface insulating layer and the material of the underlayer having the higher conductivity than the material of the surface insluting layer.

In the above-described exemplary embodiment, the underlayer having the higher conductivity than the material of the surface insulating layer is the silicon wafer itself. However, the exemplary embodiment is not limited thereto, and the underlayer may be a film formed by a film forming process.

Further, in the above-describe exemplary embodiment, the surface insulating layer is removed by a wet process of supplying the chemical liquid (hydrofluoric acid in case of the thermal oxide film (SiO$_2$) and a resist solvent in case of the resist) capable of dissolving the insulating layer onto the peripheral portion of the wafer W while rotating the wafer W. However, the exemplary embodiment is not limited thereto. The insulating layer may be removed by any of various known methods that are used to remove an unnecessary surface layer in the technical field of the semiconductor manufacture, for example, dry etching, laser-processing, mechanical polishing, etc.

Furthermore, in the above-described exemplary embodiment, the underlayer exposing process and the subsequent wafer processing (cleaning process, etc.) are performed in the separate processing units within a single housing. However, the exemplary embodiment is not limited thereto, and these processes may be performed in the separate processing units provided at different places within a semiconductor device manufacturing factory. In such a case, the above-described series of processes may be performed under the control of a host computer configured to control a multiple number of processing apparatuses provided at the semiconductor device manufacturing factory. In this case, the same control function as the control device 4 including the control unit 18 and the storage unit 19 may be implemented by the host computer.

Figure 11:
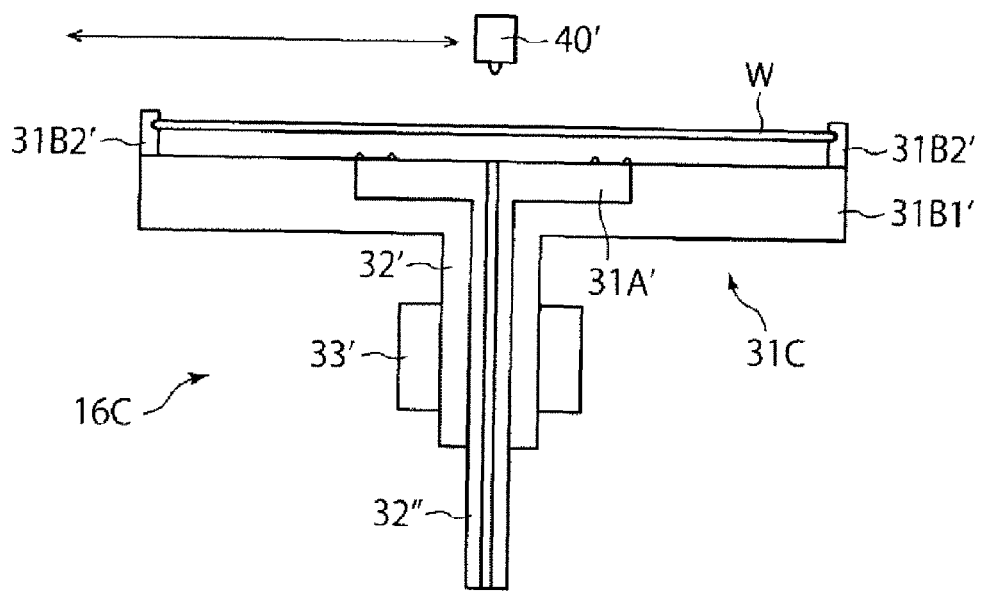
FIG. 11 is a diagram schematically illustrating a configuration of a single processing unit combining the bevel etching unit and the chemical liquid cleaning unit, and showing a state in which a chemical liquid cleaning process is performed.
Figure 12:
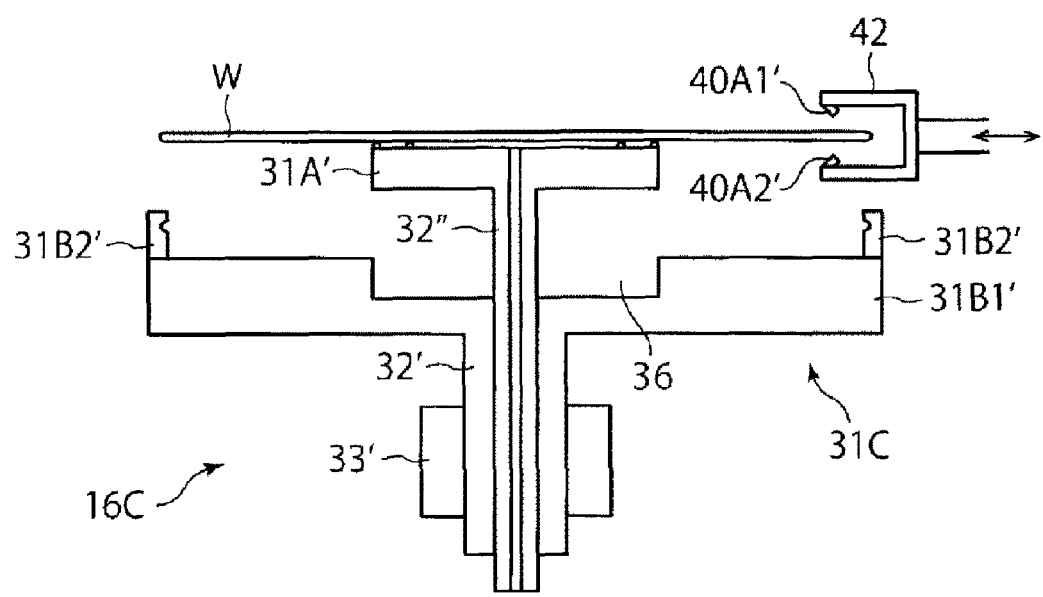
FIG. 12 is a diagram schematically illustrating the configuration of the single processing unit combining the bevel etching unit and the chemical liquid cleaning unit, and showing a state in which a bevel etching process is performed.

In addition, the underlayer exposing process and the subsequent wafer processing may be performed in a single processing unit. A schematic configuration of a processing unit 16C configured to perform these processes is illustrated in FIG. 11 and FIG. 12. The processing unit 16C of FIG. 11 and FIG. 12 is equipped with a holding device 31C including both a mechanical grip device and a vacuum attraction device. The holding device 31C includes, like the holding device 31B shown in FIG. 4, a base plate 31B1', holding members 31B2', a support unit 32' and a driving unit 33'. A recess 36 is formed at a central portion of the base plate 31B1' of the holding device 31C, and a vacuum chuck 31A' having the substantially same configuration as the vacuum chuck 31A of FIG. 3 is accommodated within the recess 36.

A support unit 32" extended downwards from the vacuum chuck 31A' is accommodated in a hole vertically elongated within the support unit 32' which is extended downwards from the base plate 31B1'. The support unit 32' and the support unit 32" are configured to be moved relative to each other in the vertical direction, but not to be rotated relative to each other. The support unit 32' and the support unit 32" can be rotated by the driving unit 33'. The support unit 32" is also configured to be moved up and down by a non-illustrated elevating device.

As depicted in FIG. 12, the wafer W is rotated in the state that the vacuum chuck 31A' configured to hold the wafer W thereon is raised, and the processing fluid (chemical liquid, rinse liquid or drying gas) required to perform the underlayer exposing process (bevel etching process or the like) is supplied onto the peripheral portion of the wafer W from nozzles 40A1' and 40A2' held by a nozzle holder 42 placed in the vicinity of the peripheral portion of the wafer W. Upon the completion of the underlayer exposing process, the vacuum chuck 31A' is lowered, and the holding members 31B2' hold the wafer W thereon. Then, the vacuum chuck 31A' releases the wafer W, and the vacuum chuck 31A' is further lowered and accommodated in the recess 36 (FIG. 11). In this state, the wafer W is rotated and the processing fluid required to perform a liquid process (e.g., cleaning process, etching process, etc.) on the wafer W is supplied onto the wafer W from a nozzle 40' placed at a position above the central portion of the wafer W. By using this single processing unit combining the bevel etching unit 16A and the chemical liquid cleaning unit 16B, the number of processes and the transfer time can be reduced.

The substrate as a target of the above-described processing is not limited to the semiconductor wafer. Various substrates such as a glass substrate and a ceramic substrate may be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

I claim:
1. A substrate processing method, comprising:
   preparing a substrate having a surface insulating layer that is classified into an upper surface insulating layer, a lower surface insulating layer and a side surface insulating layer;
   removing a peripheral portion of the lower surface insulating layer or the side surface insulating layer to expose an underlayer having higher conductivity than a material of the surface insulating layer while leaving a peripheral portion of the upper surface insulating layer unremoved;
   holding a removed peripheral portion of the substrate, where the underlayer is exposed, by a substrate holding device;
   performing a process on the substrate while rotating the substrate, by the substrate holding device,
   wherein at least a portion of the substrate holding device which comes into contact with the underlayer is made of a conductive material, and in the performing of the process on the substrate, an electric charge generated in the surface insulating layer of the substrate is removed via the underlayer and the substrate holding device.

2. The substrate processing method of claim 1,
wherein the performing of the process on the substrate includes performing a liquid process on the substrate by supplying a processing liquid onto a central portion of the substrate being rotated, or drying the substrate by shaking off and removing the processing liquid supplied on the substrate while rotating the substrate.

3. The substrate processing method of claim 1,
wherein the performing of the process on the substrate includes drying the substrate by shaking off and removing the processing liquid supplied on the substrate while rotating the substrate, and the insulating material is a hydrophilic material.

4. The substrate processing method of claim 1,
wherein the exposing of the underlayer is performed by supplying a chemical liquid for dissolving the insulating material only onto the peripheral portion of the substrate while rotating the substrate.

\* \* \* \* \*